US006096570A

United States Patent [19]

Hattori

[11] Patent Number: 6,096,570

[45] Date of Patent: Aug. 1, 2000

[54] FIELD EMITTER HAVING SHARP TIP

[75] Inventor: Atsuo Hattori, Hamamatsu, Japan

[73] Assignee: Yamaha Corporation, Japan

[21] Appl. No.: 09/335,643

[22] Filed: Jun. 18, 1999

[30] Foreign Application Priority Data

Jun. 22, 1998 [JP] Japan .................................. 10-175196

[51] Int. Cl.[7] ...................................................... H01L 21/00

[52] U.S. Cl. ................................ 438/20; 257/10; 445/24; 445/50; 313/306; 313/309; 313/310

[58] Field of Search ................................ 438/20; 257/10; 445/241, 49, 50; 313/306, 309, 310, 512

[56] References Cited

U.S. PATENT DOCUMENTS

| | | | |
|---|---|---|---|
| 5,599,749 | 2/1997 | Hattori . | |
| 5,795,208 | 8/1998 | Hattori . | |
| 5,981,305 | 11/1999 | Hattori | 438/20 |

FOREIGN PATENT DOCUMENTS

| | | |
|---|---|---|
| 5-211030 | 8/1993 | Japan . |

OTHER PUBLICATIONS

Field Emitters with β–W, Abstract of the spring meeting of the Japanese Applied Physics, No. 2 30p–T–3, 1995.*

"Dry type direct drawing system using super fine particles," Denshi Zairyou, Oct., 1994, pp. 1–9.*

"Ultra Fine Particle Conductive Paste for Low Firing Temperature Use," Journal of SHM, vol. 11, No. 1, pp. 28–31.*

"New method of forming a thin film using ultra fine particles," ULVAC Technical Journal, No. 40, pp. 14–20, 1993.*

*Primary Examiner*—Wael Fahmy
*Assistant Examiner*—Long Pham
*Attorney, Agent, or Firm*—Ostrolenk, Faber, Gerb & Soffen, LLP

[57] ABSTRACT

A method of manufacturing a field emission element includes the steps of: forming a surface insulating layer including a conductive gate film on a substrate; forming a hole in the surface insulating layer by partially removing the surface insulating layer; forming a side spacer on an inner wall of the hole and forming a gate hole in the conductive gate film, the side spacer serving as a first sacrificial film; forming a second sacrificial film on surfaces of the surface insulating layer and the side space and on a bottom surface of the gate hole, to a thickness so as to form a flat upper surface area of the second sacrificial film above the gate hole; forming a conductive first emitter film on a whole surface of the second sacrificial film; forming a conductive second emitter film by disposing a conductive ultra-fine particle group on the first emitter film and baking the ultra-fine particle group; and exposing a tip portion of the second emitter film on a side of the flat upper surface area of the first emitter film, by etching and removing an unnecessary portion including a portion of the first emitter film near the flat upper surface area. A degree of freedom of controlling the height of an emitter tip can be broadened.

11 Claims, 10 Drawing Sheets

(Prior Art)

FIELD EMITTER HAVING SHARP TIP

This application is based on Japanese patent application No. HEI 10-175196, filed on Jun. 22, 1998, all the contents of which are incorporated herein by reference.

BACKGROUND OF THE INVENTION a) Field of the Invention

The present invention relates to a method of manufacturing a field emission type element, and more particularly to a manufacture method for a field emission type element which emits electrons from a tip of a field emission cathode.

b) Description of the Related Art

A field emission type element emits electrons from a tip of a sharp emitter (field emission cathode) by utilizing electric field concentration. For example, a flat panel display is made of a field emission emitter array (FEA) having a number of emitters disposed in a predetermined pattern. Each emitter controls the luminance and the like of each pixel of the display.

A manufacture method for a field emission type emitter has been proposed, which forms a film of independent-dispersive ultra-fine particles on a sacrificial film (insulating film) on a concave shape mold.

A report on a field emission element utilizing a B-W film appears in "Field Emission Element Utilizing B-W Film" by Akama, et al, the Japan Society of Applied Physics, Spring, 1995, preliminary reports No. 2, p. 640, 30p-T-3.

JP-A-5-211030 discloses a field emission element whose cathode is made of electron emitting material filled in holes of an aluminum porous anodized oxide film.

FIG. 4B is a cross sectional view illustrating a process of forming an emitter electrode made of ultra-fine particles having an average diameter of 10 nm or smaller, according to conventional techniques (see U.S. patent application Ser. No. 09/017,865, filed on Feb. 3, 1998, now U.S. Pat. No. 5,981,305 which is incorporated herein by reference). A substrate 60 has a gate electrode 61 formed thereon and an insulating film 62 formed on the gate electrode 61. An inner spacer 63 is formed on an inner wall of a hole formed through the insulating film 62. A hole having the same cross section as the bottom of the inner spacer 63 is formed through the gate electrode 61. A sacrificial film 64 of Si oxide is formed over the whole surfaces of the inner spacer 63 and insulating film 62 and on the surface of the substrate 60 exposed at the bottom of the gate hole. As an emitter electrode, conductive and independent-dispersive ultra-fine particles 65 were coated on the sacrificial film 64 and baked. Although baking for 5 minutes at 150° C. provided a good embedding performance for ultra-fine particles, baking for 5 minutes at 200° C. generated a small void in a ultra-fine particle group 65. Baking for 5 minutes at 300° C. generated a large void (vacant hole) 66 which broken the tip portion of the emitter electrode 65 and disabled a voltage to be applied to the emitter tip.

Generation of a void results from a growth and volumetric shrinkage of fine particles, and may be ascribed to poor wettability to the surface of the Si oxide film 64. It is desired to lower the baking temperature as low as possible in order to prevent an increase in the diameters of the voids and fine particles. In order to lower the emitter resistance, baking is required to be executed at about 250° C. If the emitter resistance is large, an electric field intensity at the emitter tip becomes weak because of a large voltage drop, so that electrons are emitted less or not emitted. Even if a voltage applied across the emitter and gate electrodes is raised, a driver circuit becomes expensive and complicated and a power consumption increases.

Independent-dispersive ultra-fine particles of Au or Ag have poor adhesion to glass and $SiO_2$. In order to prevent peel-off of a mold or support substrate during manufacture processes which peel-off is caused by poor adhesion to the mold or support substrate and by a difference of thermal expansion coefficient between materials, it is necessary to avoid a high temperature process.

A field emission element utilizing a B-W film has different heights of the gate and emitter electrodes so that an electric field at the tip of the emitter electrode becomes weak.

A field emission element having the cathode made of electron emitting material filled in holes of an aluminum porous anodized oxide film cannot be formed through self-alignment. Namely, it is necessary to design it by taking into consideration a lateral position misalignment of the gate and emitter electrodes. Therefore, a space between the gate and emitter electrodes broadens, which means that the electric field at the emitter tip weakens.

The electric field characteristics and electron emission characteristics vary with the position relation and distance between the emitter and gate electrodes. Manufacture of a field emission element with the controllable size and position of an emitter electrode tip is an important factor to obtaining a desired element performance.

SUMMARY OF THE INVENTION

It is an object of the present invention to provide a method of manufacturing a field emission element capable of facilitating to control the height of an emitter tip and raising the electric field intensity at the emitter tip.

It is another object of the present invention to provide a method of manufacturing a field emission element free of disconnection of an emitter electrode even if a void is formed during manufacture processes.

According to one aspect of the present invention, there is provided a field emission element comprising: a gate electrode having an gate hole; a first insulating film formed on the gate electrode, the first insulating film having an opening whose diameter is larger than the gate hole; a spacer insulating film formed on an inner wall of the opening of the first insulating film, the spacer insulating film having an inner diameter reducing toward the gate electrode; a third insulating film formed on a surface of the first insulating film and on a surface of the spacer insulating film, the third insulating film having an opening facing the gate hole of the gate electrode; a first emitter electrode formed on the third insulating film, the first emitter electrode having an opening facing the gate hole of the gate electrode; and a second emitter electrode formed in contact with the first emitter electrode, the second emitter electrode having a tip portion protruding from the openings of the third insulating film and the first emitter electrode.

After the first emitter film and the second emitter film of ultra-fine particles are formed, the tip portion of the first emitter film is removed to protrude the second emitter film from the first emitter film. Therefore, a degree of freedom of controlling a height of the emitter tip can be broadened.

The emitter tip has a shape raising the electric field of the emitter. Since the emitter film includes the first emitter film and the second emitter film of ultra-fine particles, even if a void is formed in the ultra-fine particles, the emitter is not disconnected. The shape of the emitter tip is defined by an aggregate of fine protrusions each having a radius of curvature smaller than that of the emitter chip. Therefore, the number of emission sites increases and the emission current density is raised.

As described above, after the first emitter film and the second emitter film of ultra-fine particles are formed, the tip portion of the first emitter film is removed to protrude the second emitter film from the first emitter film. Therefore, a degree of freedom of controlling a height of the emitter tip can be broadened. The emitter tip has a shape increasing the electric field of the emitter. Since the emitter film includes the first emitter film and the second emitter film of ultra-fine particles, even if a void is formed in the ultra-fine particles, the emitter is not disconnected. A low temperature baking can be incorporated for ultra-fine particles so that the diameter of a fine particle can be prevented from becoming large.

DETAILED DESCRIPTION OF THE PREFERRED EMBODIMENTS

FIGS. 1A to 1I are cross sectional views of a substrate illustrating manufacture processes for a field emission element (two-electrode element) according to a first embodiment of the invention. The two-electrode element has two electrodes, an emitter electrode (field emission cathode) for emitting electrons and a gate electrode for controlling electron emission.

Figure 1A:
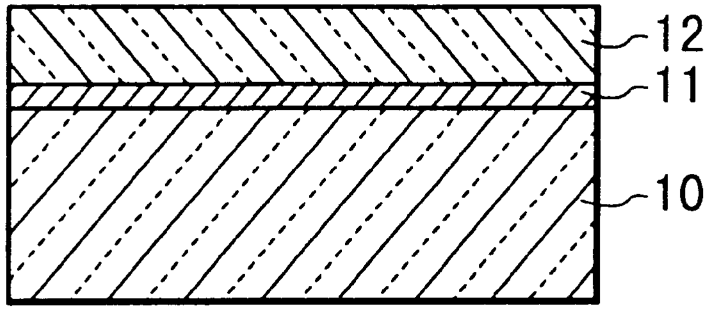
FIGS. 1A to 1I are cross sectional views of a substrate illustrating manufacture processes for a field emission element (two-electrode element) according to a first embodiment of the invention.
Figure 1B:
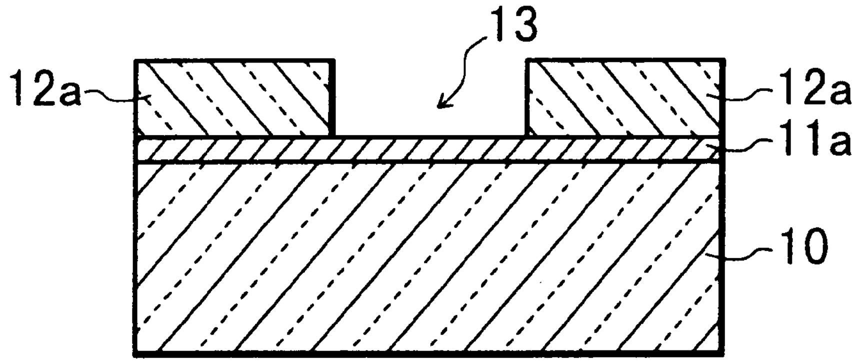

Referring to FIG. 1A, a gate electrode layer 11 is formed on a single layer substrate 10 made of, e.g., glass, quartz or the like or on a substrate 10 having a silicon oxide film laminated on Si. The gate electrode layer 11 is made of polycrystalline or amorphous silicon film doped with P (phosphorus) or B (boron) and having a thickness of about 0.1 $\mu$m.

For example, the Si film is formed under the conditions that $SiH_4$ gas diluted with He is supplied as the source gas to a film forming chamber and the substrate temperature is set to 625° C. P, B or the like is diffused or implanted in order to lower the resistance value.

Thereafter, a first sacrificial film (insulating film) 12 is formed on the gate electrode layer 11. For example, as the first sacrificial film, an Si oxide film 12 is deposited on the gate electrode layer 11 to a thickness of about 0.2 $\mu$m under the conditions of source gases of $O_3$ and TEOS (tetraethoxy silane) and a substrate temperature of 400° C.

Next, a resist pattern (not shown) having a predetermined shape exposing a partial surface area of the first sacrificial film 12 is formed through photolithography. By using this resist pattern as a mask, the first sacrificial film 12 is anisotropically etched to form an opening 12 shown in FIG. 1. The opening 13 has a generally vertical inner wall. The plan shape (upper surface shape) of the opening 13 is a circle having a diameter of 0.5 $\mu$m. A depth of the opening 13 corresponds to the thickness of the $SiO_2$ film 12, i.e., about 0.2 $\mu$m. The resist pattern is thereafter removed. In order to prevent a deformed shape to be caused by softening of resist, it is preferably to supply He to the substrate bottom and cool the substrate.

Figure 1C:
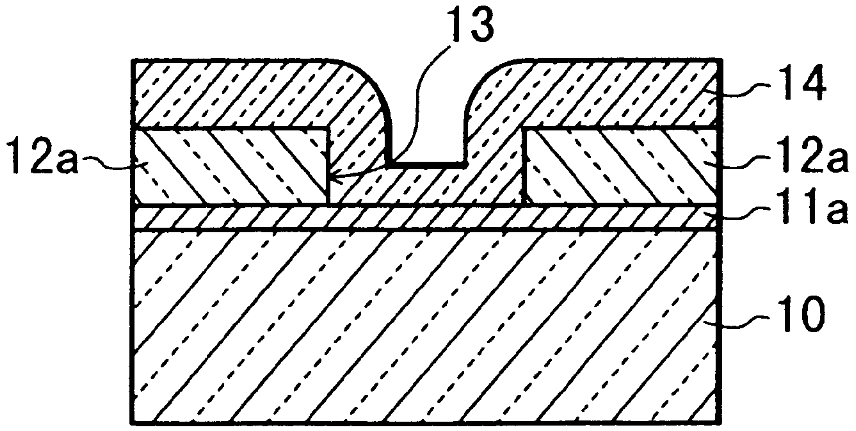

Next, as shown in FIG. 1C, a silicon oxide film is deposited to a thickness of about 0.15 $\mu$m on a patterned first sacrificial film 12*a* and on the gate electrode 11 exposed at the bottom of the opening 13, to thereby form a second sacrificial film (insulating film) 14. The second sacrificial film 14 is formed by using $O_3$ and TEOS as source gases at a substrate temperature of 400° C.

Figure 1D:
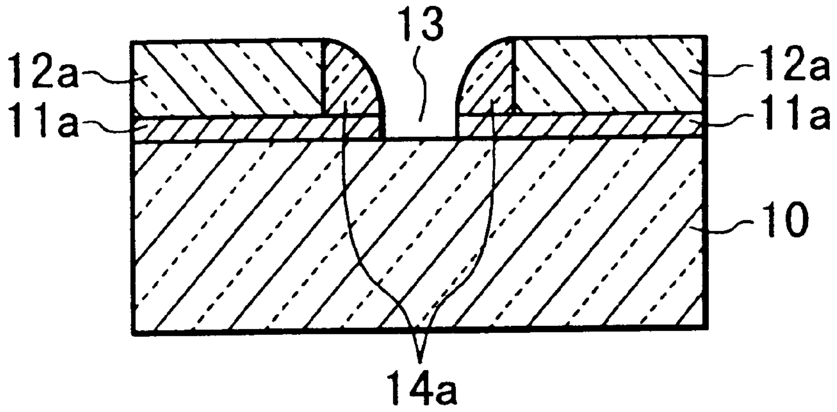

Next, as shown in FIG. 1D, the second sacrificial film 14 is anisotropically dry-etched (etched back) to leave as a side spacer 14*a* the second sacrificial film 14 on the inner wall of a recess 13 formed in the first sacrificial film 12*a*.

The first sacrificial film 12*a* is etched by using, for example, a magnetron RIE (reactive ion etching) system. A mixture gas of $CHF_3$+$CO_2$+Ar is used as etching gas. The pressure in a reaction chamber is set to, for example, 50 mTorr.

By using the first sacrificial film 12*a* and side spacer 14*a* as a mask, the gate electrode layer 11 is etched to form an opening having a predetermined pattern through the gate electrode layer 11 to thereby form a gate electrode 11a shown in FIG. 1D.

Figure 1E:
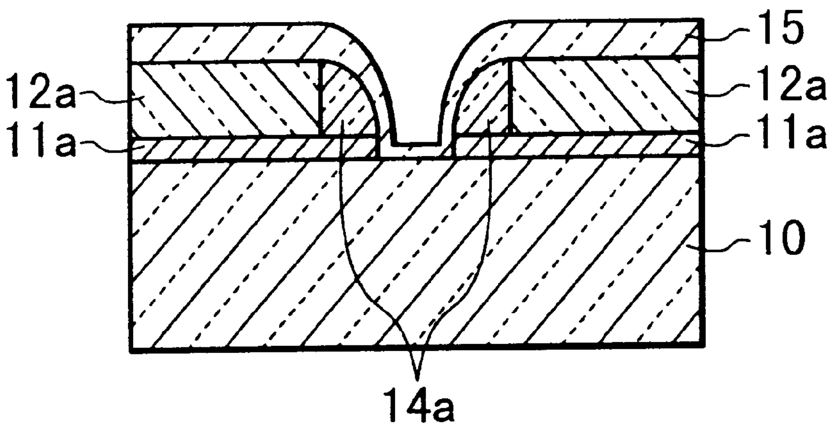

Next, as shown in FIG. 1E, a third sacrificial film (insulating film) 15 of Si oxide is formed on the substrate whole surface through low pressure CVD to a thickness of about 0.12 $\mu$m, this film 15 being formed so as to have a flat surface at the bottom of the recess 13. For example, the conditions of forming this film 15 are a source gas of TEOS, a pressure of 30 Pa and a substrate temperature of 710 ° C.

Figure 1F:
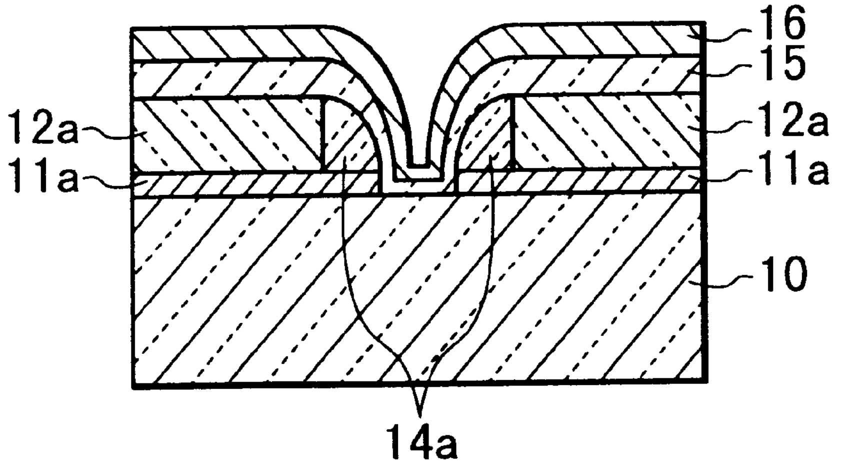

Next, as shown in FIG. 1F, a first emitter electrode film 16 of, for example, $TiN_x$, is deposited on the third sacrificial film 15 to a thickness of about 0.1 $\mu$m through reactive sputtering in a DC sputtering system. Ti may be used as a sputtering target in an atmosphere of a mixture gas of $N_2$+Ar, or more generally, $TiN_x$ may be used as a sputtering target in an atmosphere of $N_2$ gas. Vapor deposition may be used for depositing $TiN_x$. The first emitter electrode film 16 may be made of metal such as Ti, W, Mo, Ni, Cr, Au, Pt, Pd and Ag or alloy such as $TiO_xN_y$, $TiW_x$ and $CrN_x$.

Figure 1G:
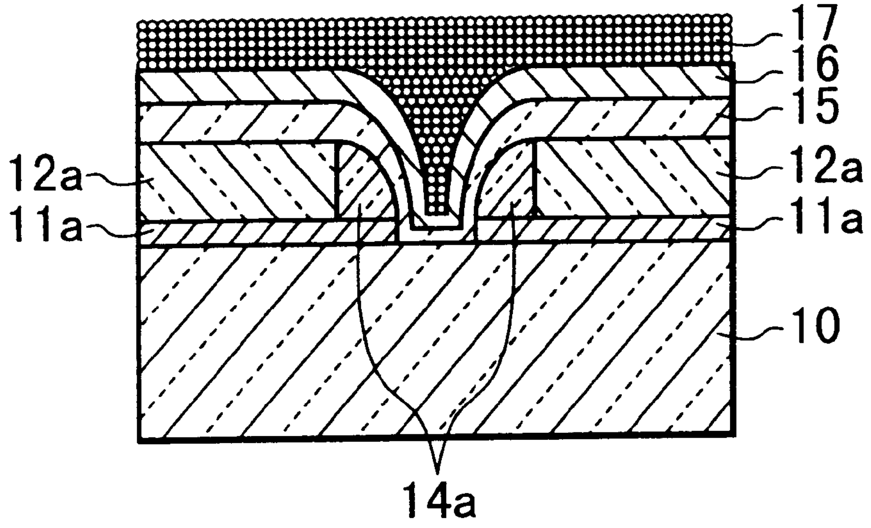

Next, as shown in FIG. 1G, a second emitter electrode film 17 is formed on the first emitter electrode film 16. As the material of the second emitter electrode film 17, independent-dispersive ultra-fine particles of Au, Pt, Pd, Ag or the like having an average particle diameter of 10 nm or smaller are used, and in order to evaporate organic solvent and surface active agent (dispersing agent) of the ultrafine particles coated on the first emitter electrode film, the substrate is baked at a temperature of 200 to 300° C.

It is desired to bake the substrate at a temperature of 200° C. or lower in order to minimize an increase in the radius of curvature of ultra-fine particle. At 200° C. or lower, although the resistance of the second emitter electrode film 17 increases, a voltage drop at the tip (on the substrate inner side) of the second emitter electrode film 17 can be mitigated because the first emitter electrode film 16 has a low resistance. The shape of the emitter tip is defined by an aggregate of fine projections each having a small radius of curvature. A height of the emitter can be controlled more easily, and in addition fine particles forming the second emitter electrode film can be filled easily in the recess of the first emitter electrode film 16 and electron emission at a low voltage becomes possible. Furthermore, since there are many electron emission sites, a large emission current can be obtained. At a temperature of 200° C. or lower, since the surface active agent (dispersing agent) is left, a process of removing this agent is executed after the baking. An emitter whose tip is an aggregate of projections each having a small radius of curvature can be formed in a self-alignment manner, so that a large emission current can be obtained. The second emitter electrode film may be formed by coating diamond fine particles dispersed in water and baking them at 100 to 200° C. Instead of a coating process for forming a ultra-fine particle film, independent-dispersive ultra-fine particles may be directly drawn on the first emitter electrode film 16 in a dry state by using a jet printing system. Since this jet printing system does not use organic solvent and surface active agent, baking for evaporating these solvent and agent is unnecessary. However, also in this case, adhesion to a support substrate can be improved by raising a baking temperature. In order to leave spaces between particles, it is desired to satisfy both adhesion and particle shape by setting the baking temperature to 200° C. or lower and by setting a pressure difference between a ultra-fine particle generating chamber and a film forming chamber to 3 atmospheric pressure or lower.

In place of ultra-fine particles, the above-described noble metals may be used for forming the second emitter electrode film through plating. Dispersive (composite) plating is very effective. For example, diamond fine particles may be dispersed in an electrolytically plated film of Ni, Ca, Cu, Zn, Cr or the like. Metal such as Al, Cr, Ni, Mo, and Hf may be sputtered or vapor-deposited to form the second emitter electrode film 17, or W, Cu, Al or the like may be used to form the second electrode film 17 through CVD.

Independent-dispersive ultra-fine particles having an average particle diameter of 10 nm or smaller and manufactured by a gas evaporation method are dispersed in organic solvent such as α-terpineol. In order to enhance form reservation stability, surface active agent is generally added. Ultra-fine particles having an average particle diameter of 10 nm or smaller manufactured by the gas evaporation method exist in an isolated state without being coagulated. Therefore, if they are directly jet-printed on the substrate, organic solvent and surface active agent are not necessary.

Diamond ultra-fine particles having a uniform distribution of particle diameters of 5 nm manufactured by implosion synthesis may be washed with acid and dispersed to form colloidal solution.

Figure 1H:
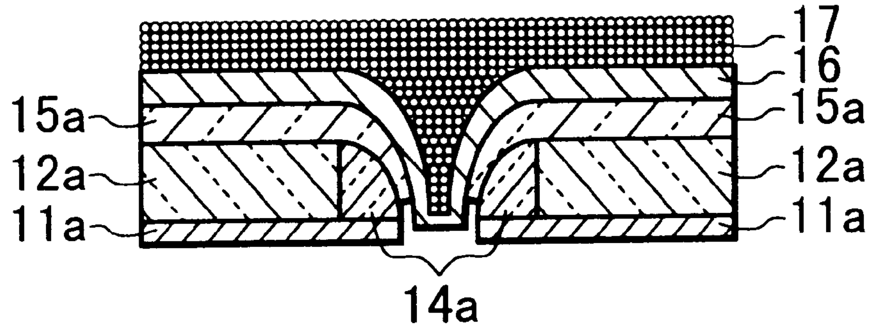

Next, as shown in FIG. 1H, the substrate is etched from the bottom side thereof to remove the substrate 10 and the flat portion of the third sacrificial film 15 and expose the first emitter electrode film 16. For etching Si such as the Si substrate 10, $HF+HNO_3+CH_3COOH$ are used. For etching a silicon oxide film or the like, $HF+NH_4F$ are used.

Figure 1I:
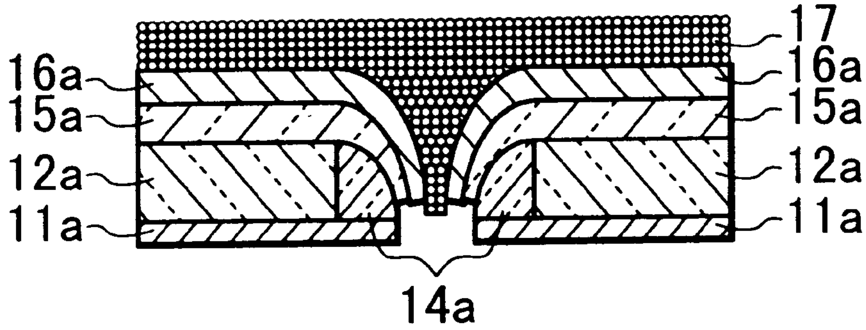

Lastly, as shown in FIG. 1I, the tip portion of the exposed first emitter electrode film 16 with its flat portion being removed is etched and removed to form a first emitter electrode 16*a* having an opened tip portion (which is called a crater where applicable). The tip of the second emitter electrode film is exposed in the crater, and a tip portion of the second emitter electrode film projects from the top end of the first emitter electrode film 16*a*.

$H_2SO_4+H_2O_2$ heated to about 130° C. are used for the etching process for forming the crater of the first emitter electrode film 16 made of $TiN_x$. Reactive ion etching using $CF_4$ or $Cl_2$ gas may be used. With the low temperature baking at 200° C., surface active agent is left on the surfaces of independent-dispersive ultra-fine particles. However, surface active agent attached to the tip portion of the second emitter electrode film 17 can be removed when the crater is formed.

Figure 4A:
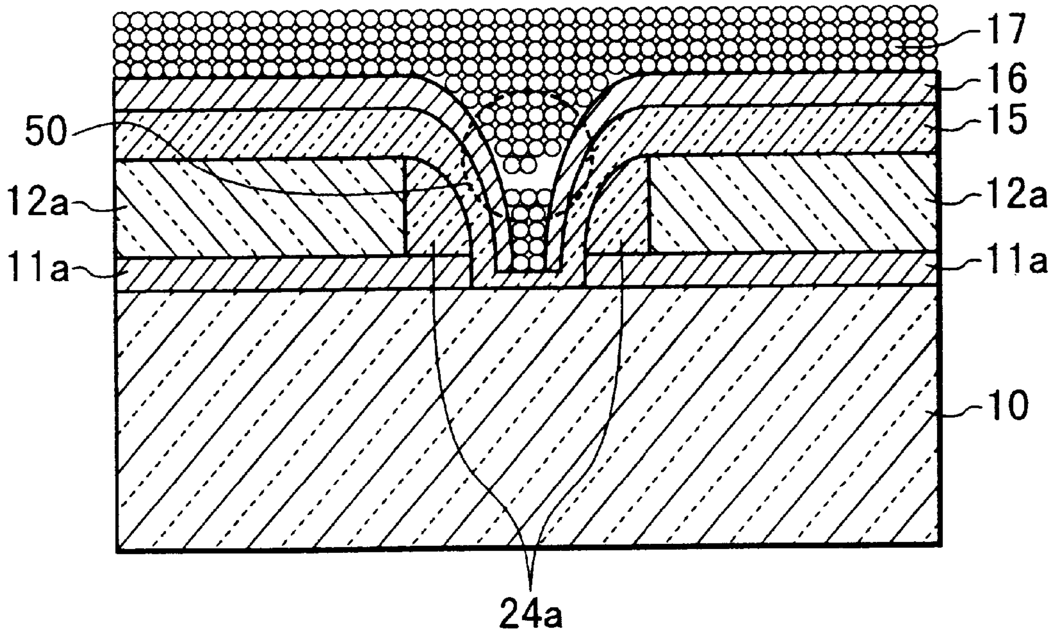
FIG. 4A is a cross sectional view detailing a field emission element according to the first embodiment.
Figure 4B:
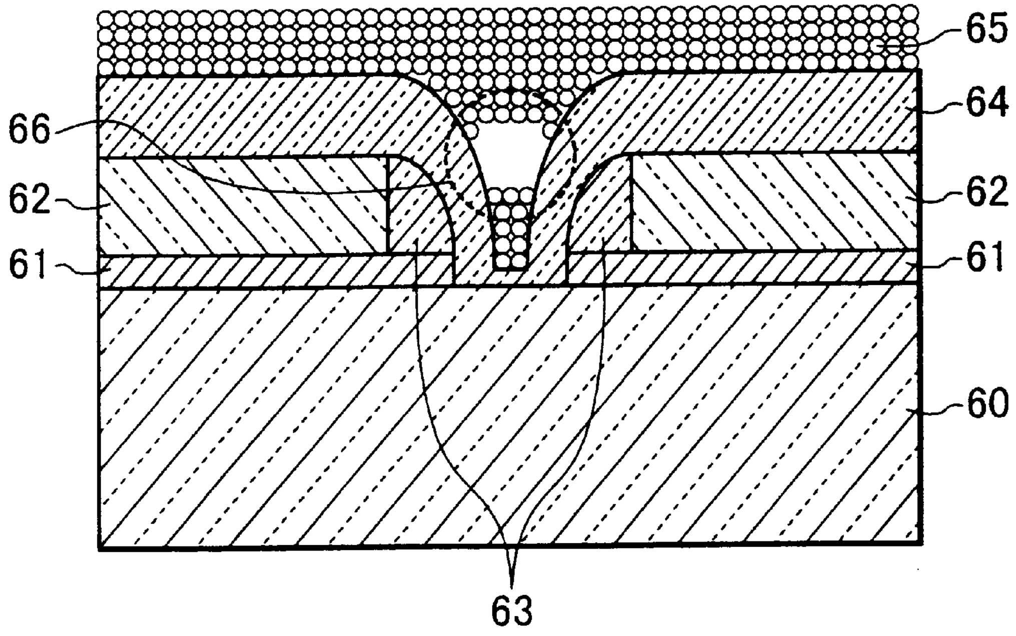
FIG. 4B is a cross sectional view of a conventional field emission element.

FIG. 4A is a cross sectional view detailing a field emission element after the baking process for independent-dispersive ultra-fine particles illustrated in FIG. 1G. A large void 50 is formed in some case in ultra-fine particles and the second emitter film 17 is disconnected at this void. Even in such a case, electrical conduction of the entirety of the emitter electrode can be retained by the first emitter electrode film 16. It is therefore guaranteed that a voltage is applied to the tip of the second emitter electrode film 17. In the example shown in FIG. 4B wherein the emitter electrode is formed by baking independent-dispersive ultra-fine particles according to conventional techniques, the first emitter electrode film as in the embodiment of the invention is not provided. If such a void is formed, the field emission element becomes defective.

Figure 2A:
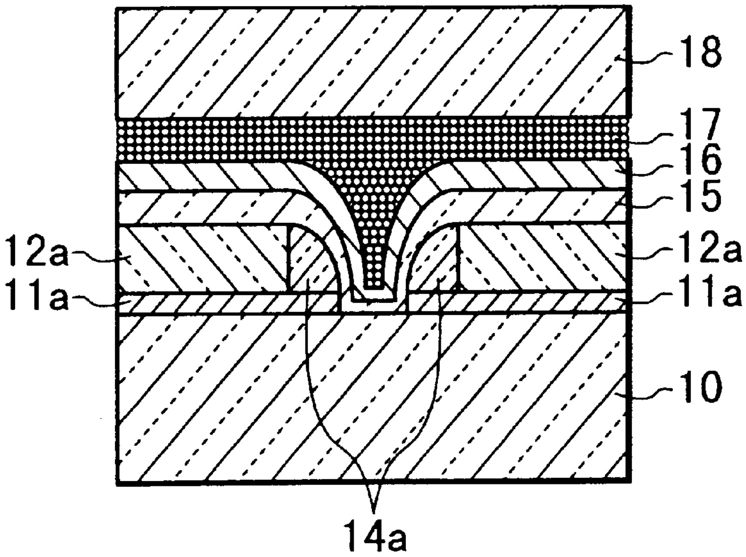
FIGS. 2A to 2C are cross sectional views of a substrate illustrating other manufacture processes for a field emission element according to the first embodiment.
Figure 2B:
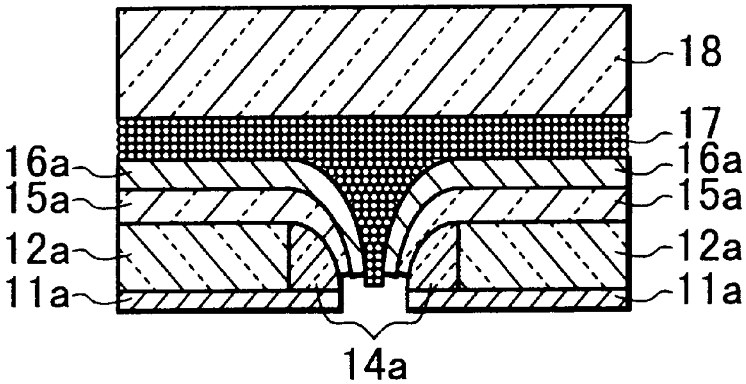
Figure 2C:
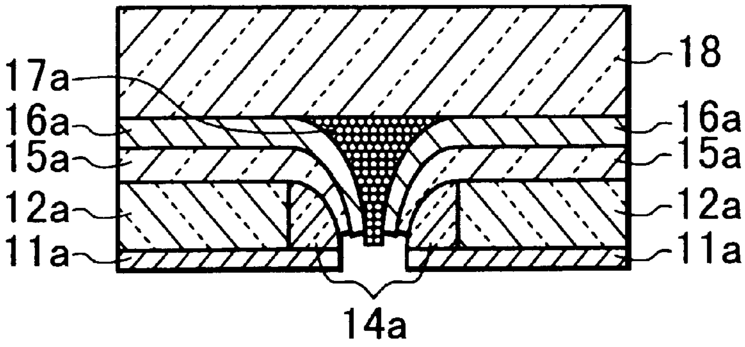

FIGS. 2A to 2C illustrate modifications of the first embodiment which reinforces the second emitter electrode film 17 with a support substrate.

As shown in FIG. 2A, a support substrate 18 is adhered through electrostatic adhesion to the second emitter electrode film 17 of the element of the first embodiment formed by the process illustrated in FIG. 1G.

If an insulating film made of such as glass and quartz is used as the support substrate 18, it is preferable to deposit $TiN_x$ as a tight adhesion layer on the second emitter electrode film 17 through reactive sputtering, and thereafter adhere the support substrate 18 to the tight adhesion layer. This reactive sputtering is performed by using a DC sputtering system under the conditions of a target of Ti and sputtering gases of $N_2$+Ar, or more generally, a target of $TiN_x$ is used while $N_2$ gas is introduced. Vapor deposition may also be used. The tight adhesion layer may be made of metal such as Ti, W, Mo, Ni, Cr, Au, Pt, Pd, and Ag or alloy such as $TiO_xN_y$, $TiW_x$ and $CrN_x$.

Next, unnecessary portions such as substrate 10 are etched and removed by a method similar to the etching process illustrated in FIG. 1H. Thereafter, the tip portion of the first emitter electrode film 16 is removed to form a crater by a method similar to the etching process illustrated in FIG. 1I, to thus complete the two-electrode element reinforced with the support substrate, as shown in FIG. 2B.

In a modification shown in FIG. 2C, after the process illustrated in FIG. 1G, the whole surface of the second emitter electrode 17 is etched through ion milling or the like to leave a second emitter electrode portion 17*a* only in the recess of the first emitter electrode film. Thereafter, prior to the process of etching and removing unnecessary portions such as substrate 10, a support substrate 18 is adhered to the first and second emitter electrode portions 16*a* and 17*a* through electrostatic adhesion to impart a mechanical strength to the emitter electrode portions. After this process, a crater is formed in the tip portion of the first emitter electrode portion 16*a* by an etching process similar to that illustrated in FIG. 1I.

FIGS. 3A to 3H are cross sectional views of a substrate illustrating manufacture processes for a field emission element (three-electrode element) according to a second embodiment of the invention. The three-electrode element has three electrodes, an emitter electrode, a gate electrode and an anode electrode.

Figure 3A:
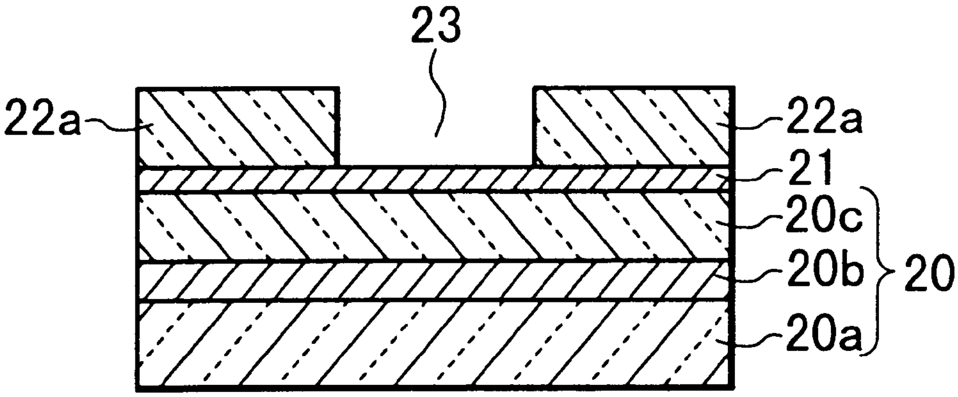
FIGS. 3A to 3H are cross sectional views of a substrate illustrating manufacture processes for a field emission element (three-electrode element) according to a second embodiment of the invention.

Referring to FIG. 3A, a substrate 20 has: a starting substrate 20*a* having a silicon oxide film on the surface thereof; an anode electrode layer 20*b* deposited to a thickness of 0.15 μm on the starting substrate 20*a* and made of polycrystalline silicon doped with P or B; and a first sacrificial film 20*c* made of $SiO_2$ deposited on the anode electrode layer 20*b*.

Next, a gate electrode film 21 is deposited on the first sacrificial film 20*c* to a thickness of 0.1 μm, the gate electrode film being made of polycrystalline silicon doped with P or B. Sequentially thereafter, a second sacrificial film 22 of Si oxide is deposited to a thickness of 0.2 μm on the gate electrode film 21.

Next, a resist pattern (not shown) having a predetermined shape exposing a partial surface area of the second sacrificial film 22 is formed through photolithography. By using this resist pattern as a mask, the second sacrificial film 22 is anisotropically etched to leave a second sacrificial film 22*a* having a predetermined pattern with a recess 23 as shown in FIG. 3A. The recess 23 has a generally vertical inner wall. The plan shape (upper surface shape) of the recess 23 is a circle having a diameter of 0.5 μm. A depth of the recess 23 corresponds to the thickness of the second sacrificial film 22, i.e., about 0.2 μm. The resist pattern is thereafter removed.

This etching is a dry etching using a magnetron RIE system, for example. $CHF_3$ is used as etching gas and a pressure in the reaction chamber is set to 50 mTorr.

Next, a silicon oxide film is deposited to a thickness of about 0.15 μm through atmospheric pressure CVD on the patterned second sacrificial film 22*a* and on the gate electrode film 21 exposed at the bottom of the recess 23, to thereby form a third sacrificial film 24. For example the third second sacrificial film 24 is formed by using $O_3$ and TEOS as source gases at a substrate temperature of 400° C.

Next, the third sacrificial film 24 is anisotropically dry-etched (etched back) to leave as a side spacer 24*a* the third sacrificial film 24 only on the inner wall of the recess 23 formed in the second sacrificial film 22*a*.

Figure 3B:
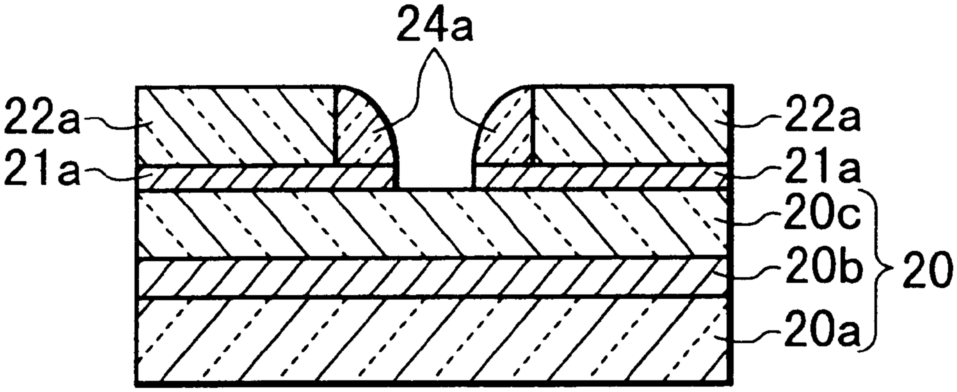

Next, as shown in FIG. 3B, the gate electrode film 21 is etched by using the second sacrificial film 22*a* and side spacer 24*a* as a mask. Anisotropical dry etching is used for etching the gate electrode film 21. For example, a magnetron RIE system is used for the dry etching, and HBr is used as etching gas at a pressure in the reaction chamber of 100 mTorr.

Figure 3C:
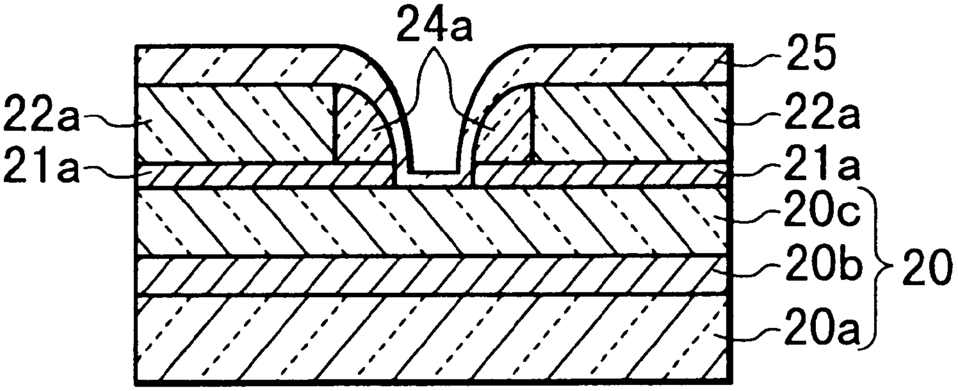

Next, as shown in FIG. 3C, a fourth sacrificial film (insulating film) 25 of silicon oxide is isotropically deposited through low pressure CVD on the substrate whole surface to a thickness of about 0.12 μm, this film 25 being formed so as to have a flat surface at the bottom of the recess 23. For example, the fourth sacrificial film 25 is formed under the conditions of a source gas of TEOS, a pressure of 30 Pa, and a substrate temperature of 710° C.

Figure 3D:
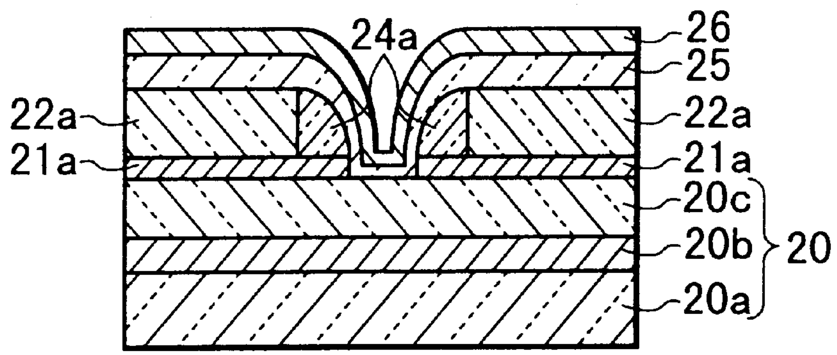

Next, as shown in FIG. 3D, a first emitter electrode film 26 of, for example, $TiN_x$, is deposited to a thickness of 0.1 μm on the fourth sacrificial film 25 through reactive sputtering using a DC sputtering system under the conditions of a target of Ti while $N_2$+Ar gases are introduced.

Figure 3E:
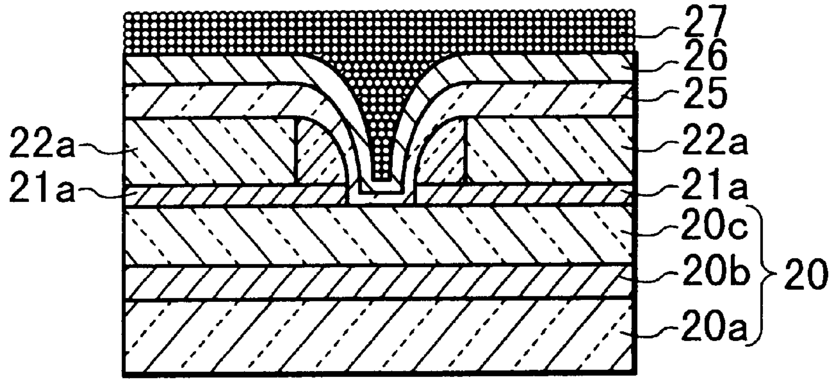

Next, as shown in FIG. 3E, a second emitter electrode film 27 is formed on the first emitter electrode film 26. As the material of the second emitter electrode film 27, independent-dispersive ultra-fine particles of Au, Pt, Pd, Ag or the like having an average particle diameter of 10 nm or smaller are used, and in order to evaporate organic solvent and surface active agent (dispersing agent) of the ultra-fine particles coated on the first emitter electrode film, the substrate is baked at a temperature of 200 to 300° C.

It is desired to bake the substrate at a temperature of 200° C. or lower in order to minimize an increase in the radius of curvature of ultra-fine particle. The shape of the emitter tip is defined by an aggregate of fine projections each having a small radius of curvature. A height of the emitter can be controlled more easily, and in addition fine particles forming the second emitter electrode film can be filled easily in the recess of the first emitter electrode film 26 and electron emission at a low voltage becomes possible. Furthermore, since there are many electron emission sites, a large emission current can be obtained. At a temperature of 200° C. or lower, since the surface active agent (dispersing agent) is left, a process of removing this agent is executed after the baking. An emitter whose tip is defined by an aggregate of projections each having a small radius of curvature can be formed in a self-alignment manner, so that a large emission current can be obtained. The second emitter electrode film may be formed by coating diamond fine particles dispersed in water and baking them at 100 to 200° C. Instead of the coating process for forming a ultra-fine particle film, independent-dispersive ultra-fine particles may be directly drawn on the first emitter electrode film 26 in a dry state by using a jet printing system. Since this jet printing system does not use organic solvent and surface active agent, baking for evaporating these solvent and agent is unnecessary. However, also in this case, adhesion to a support substrate can be improved by raising a baking temperature. In order to leave spaces between particles, it is desired to satisfy both adhesion and particle shape by setting the baking temperature to 200° C. or lower and by setting a pressure difference between a ultra-fine particle generating chamber and a film forming chamber to 3 atmospheric pressure or lower.

In place of ultra-fine particles, noble metals such as Au, Pt, Pd and Ag may be used for forming the second emitter electrode film through plating. Dispersive (composite) plating is very effective. For example, diamond fine particles may be dispersed in an electrolytically plated film of Ni, Ca, Cu, Zn, Cr or the like. Metal such as Al, Cr, Ni, Mo, and Hf may be sputtered or vapor-deposited to form the second emitter electrode film 27, or W, Cu, Al or the like may be used to form the second electrode film 27 through CVD.

Figure 3F:
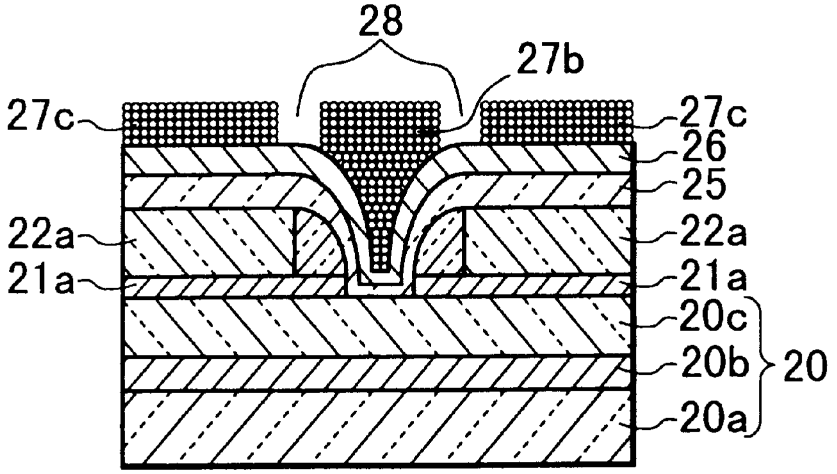

A resist pattern (not shown) is formed on the second emitter electrode film 27 through usual photolithography to etch and remove portions not used as the emitter electrode and form slit openings 28 and second emitter electrode portions 27*b*, 27*c* as shown in FIG. 3F. This etching is performed by ion milling, for example, by using Ar gas under the conditions of an acceleration energy of 700 eV, a current of 800 mA, and an ion beam incidence angle of 0 degree (along a substrate normal direction).

Figure 3G:
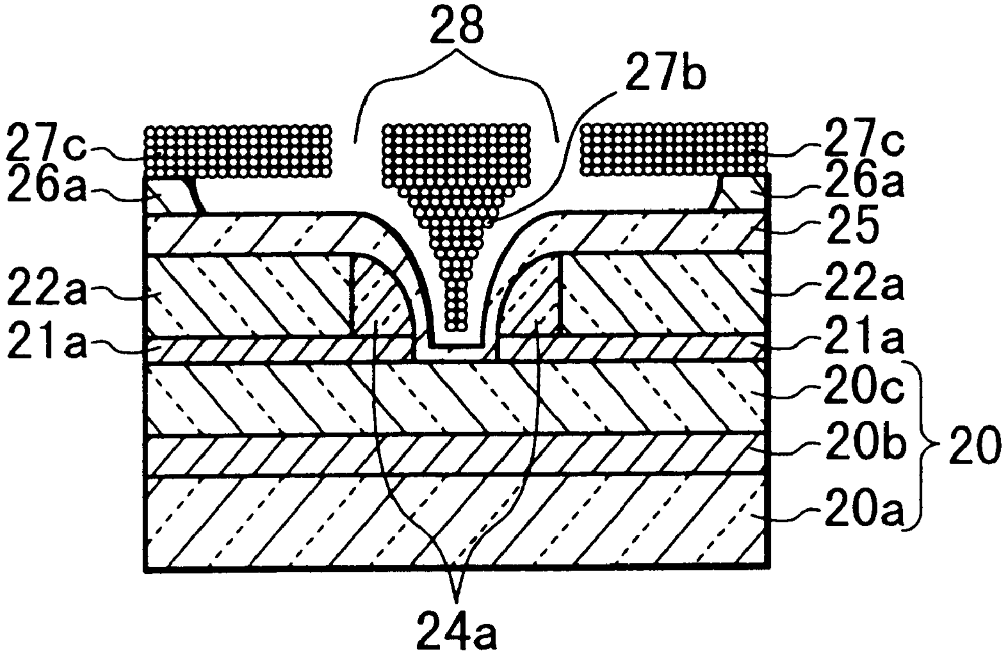

Next, as shown in FIG. 3G, the first emitter electrode film 26 is partially removed through isotropic wet etching via the slit openings 28. $H_2SO_4$+$H_2O_2$ heated to about 130° C. are used for etching the first emitter electrode film 26 made of $TiN_x$. Reactive etching using $CF_4$ or $Cl_2$ gas may be used. With the low temperature baking at 200° C., surface active agent is left on the surfaces of independent-dispersive ultra-fine particles. However, surface active agent attached to the tip portion of the second emitter electrode film 27 can be removed when the crater is formed.

Figure 3H:
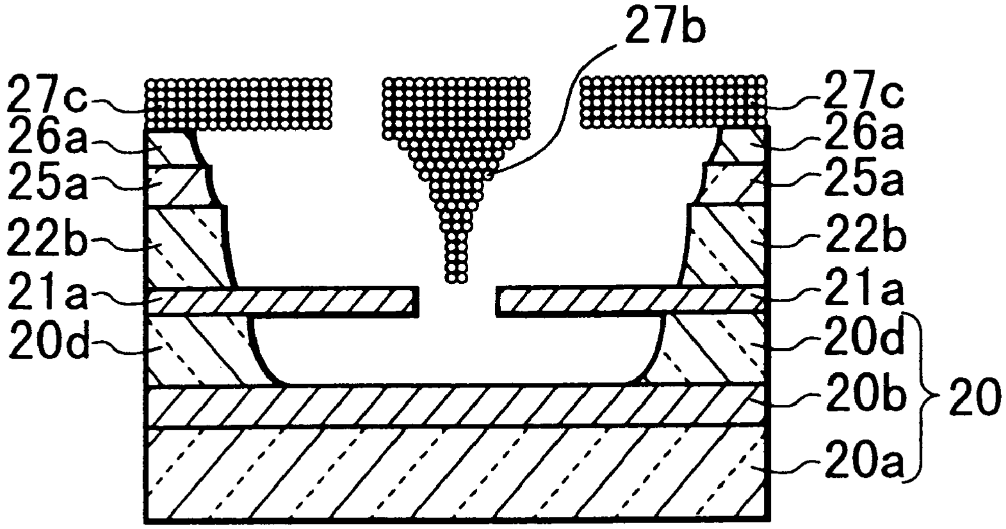

Next, as shown in FIG. 3H, a portion of the first sacrificial film 20*c*, the side spacer 24*a*, a portion of the second sacrificial film 22*a* are isotropically wet-etched to remove unnecessary portions and expose the second emitter electrode portion 27*b*, gate electrode 21*a* and anode electrode 20*b* to complete a three-electrode element. For etching $SiO_2$, $HF+NH_4F$ are used.

Figure 5:
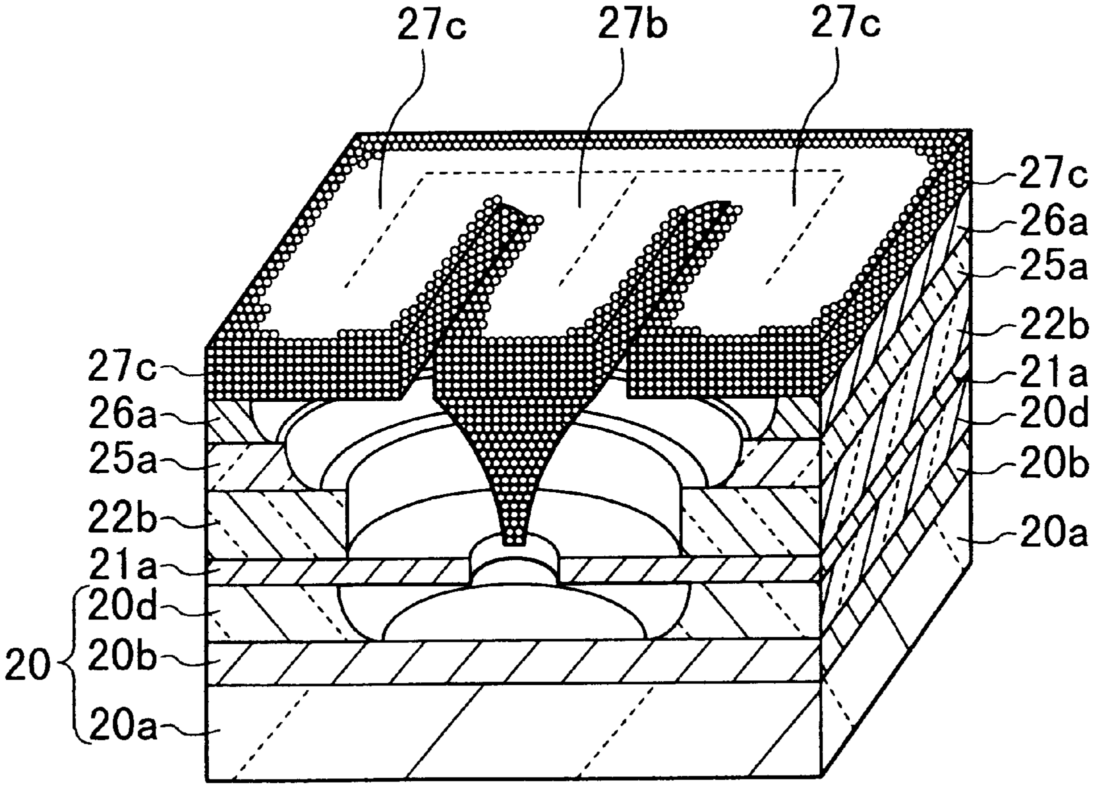
FIG. 5 is a perspective view of a field emission element according to an embodiment of the invention.

FIG. 5 is a perspective view of the three-electrode element of the second embodiment shown in FIG. 3H. Two slits 28,28 are formed at both side of the second emitter electrode 27*b* such that the inside edge of the slit is located at the outside of the second emitter electrode. The emitter electrode portion 27*b* is continuous with and supported by the emitter electrode portion 27*c*. The gate electrode 21*a* has a circular hole (gate hole) near the outer periphery of the tip of the emitter electrode 27*b*. The tip of the emitter electrode 27*b* has a sharp Konide shape near at the gate hole of the gate electrode 21*a*. The tip portion of the emitter electrode 27*b* is defined by an aggregate of fine projections formed by the outer surfaces of a number of fine particles each having a small radius of curvature. The height of the emitter electrode can be controlled more easily, fine particles forming the emitter electrode can be filled easily in the recess of the first emitter electrode film 26 and electron emission at a low voltage becomes possible. Furthermore, since the tip portion of the emitter electrode is defined by the outer surfaces of a number of fine particles and there are many electron emission sites, a large emission current can be obtained. With conventional techniques, each emitter tip has a different radius of curvature and height because of a variation in the in-plane diameters of gate holes of the emitter electrodes 21*a* and an in-plane thickness distribution of the fourth sacrificial film 25. There is therefore an in-plane emission current distribution of FEA so that the luminance of the flat panel display is not uniform. In contrast with this, according to the embodiments, the radius of curvature of each emitter tip is determined by the diameter of each independent-dispersive ultra-fine particle. Since the uniformity of diameters of fine particles is excellent, an in-plane emission current distribution is small and the luminance of the flat panel display becomes more uniform.

The three-electrode element has the emitter electrode 27*b* as the cathode and the anode electrode 20*b*. When a positive potential is applied to the gate electrode 21*a*, electrons are emitted from the emitter electrode 27*b* toward the anode electrode 20*b*.

Figure 6:
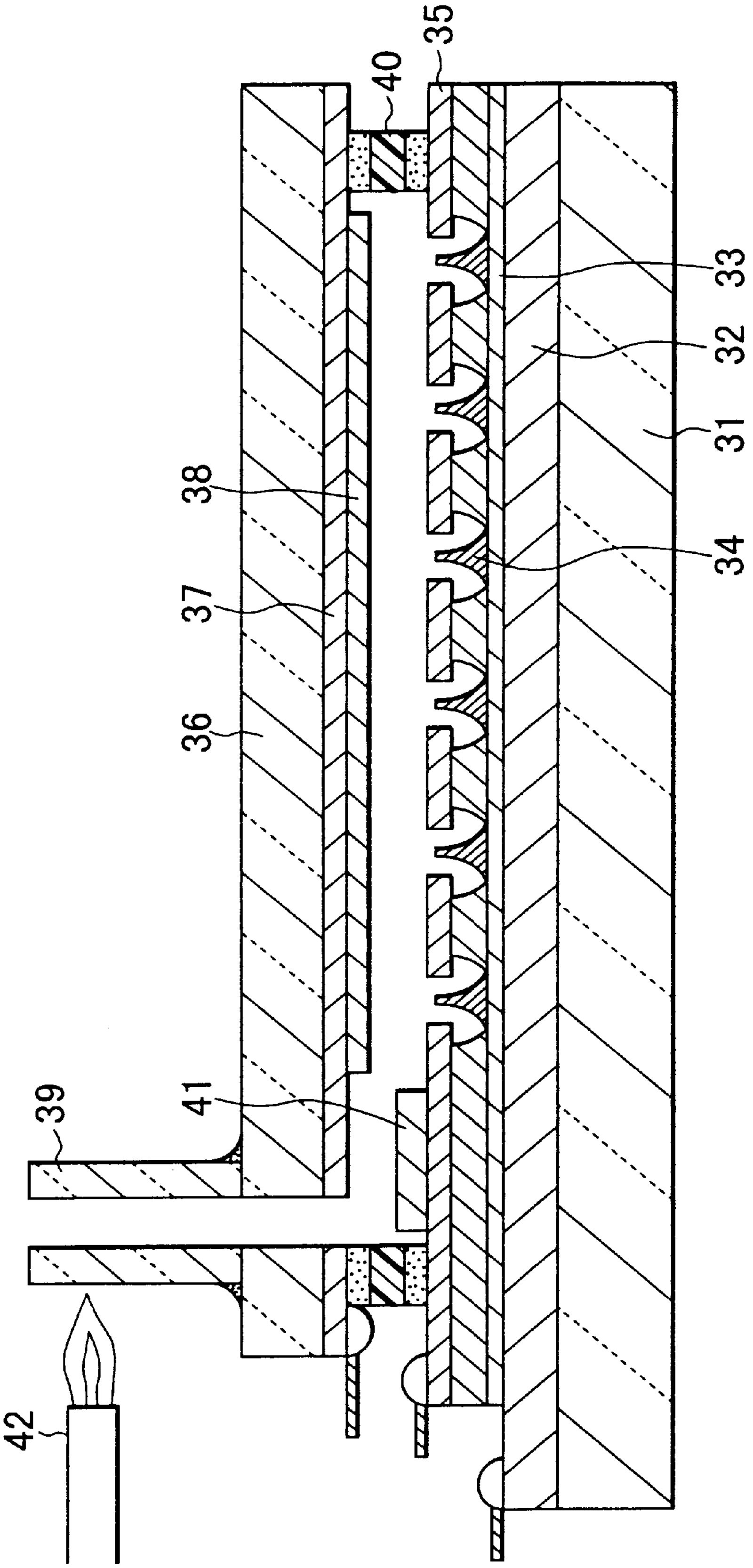
FIG. 6 is a cross sectional view of a flat panel display using field emission elements.

FIG. 6 is a cross sectional view of a flat panel display using field emission elements of the embodiment.

Each field emission element used is a two-electrode element formed by the first embodiment. Formed on a support substrate 31 made of insulating material are a wiring layer 32 made of Al, Cu, or the like and a resistor layer 33 made of polysilicon or the like. On the resistor layer 33, a number of emitter electrodes 34 having a Konide shape tip are disposed to form a field emitter array (FEA). Each gate electrode 35 has an opening (gate hole) near at the tip of each emitter electrode 34 and a voltage can be applied independently to each gate electrode. A plurality of emitter electrodes 34 can also be independently applied with a voltage.

Facing an electron source including the emitter electrode 34 and gate electrode 35, an opposing substrate is disposed including a transparent substrate 36 made of glass, quartz, or the like. The opposing substrate has a transparent electrode (anode electrode) 37 made of ITO or the like disposed under the transparent electrode 36, and a fluorescent member 38 disposed under the transparent electrode 37.

The electron source and opposing substrate are joined together via a spacer 40 made of a glass substrate and coated with adhesive, with the distance between the transparent electrode 37 and emitter electrode 34 being maintained about 0.1 to 5 mm. The adhesive may be low melting point glass.

Instead of the spacer 40 of a glass substrate, a spacer 40 made of adhesive such as epoxy resin with glass beads being dispersed therein may be used.

A getter member 41 is made of Ti, Al, Mg, or the like and prevents emitted gas from attaching again to the surface of the emitter electrode 34.

An air exhaust pipe 39 is coupled to the opposing substrate. By using this air exhaust pipe 39, the inside of the flat display panel is evacuated to about $10^{-5}$ to $10^{-9}$ Torr, and then the air exhaust pipe 39 is sealed by using a burner 42 or the like. Thereafter, the anode electrode (transparent electrode) 37, emitter electrode 34, gate electrode 35 are wired to complete the flat panel display.

The anode electrode (transparent substrate) 37 is always maintained at a positive potential. Each display pixel is two-dimensionally selected by the emitter wiring and gate wiring. Namely, a field emission element disposed at a cross point between voltage applied emitter wiring and gate wiring is selected.

The emitter electrode 34 and gate electrode 35 are applied with negative and positive potentials, respectively, and electrons are emitted from the emitter electrode 34 toward the gate electrode 37. When electrons are applied to the fluorescent member 38, light is emitted from the electron bombarded area (pixel).

The material of the gate and emitter electrodes may be semiconductor such as polycrystalline silicon, amorphous silicon and diamond, silicide compound such as $WSi_x$, $TiSi_x$ and $MoSi_x$, or metal such as Al, Cu, W. Mo, Ni,Cr, Hf and $TiN_x$.

If diamond is used, diamond fine particles dispersed in solvent may be coated and baked at a low temperature of 100 to 200° C., or may be filled in a plated metal film by the composite plating method.

In the above embodiment, although the side spacer is made of insulating material, it may be made of a conductive material. The sacrificial film, insulating film and side spacer may be a silicon nitride film, a silicon oxide film or a silicon oxynitride film.

The present invention has been described in connection with the preferred embodiments. The invention is not limited only to the above embodiments. It is apparent that various modifications, improvements, combinations, and the like can be made by those skilled in the art.

What I claim are:

1. A method of manufacturing a field emission element comprising the steps of:

(a) forming a conductive gate film and a surface insulating layer on a substrate;

(b) forming a hole in the surface insulating layer by partially removing the surface insulating layer;

(c) forming a side spacer on an inner wall of the hole and forming a gate hole in said conductive gate film, the side spacer serving as a first sacrificial film;

(d) forming a second sacrificial film on surfaces of the surface insulating layer and the side spacer and on a surface of the substrate at the gate hole, to a thickness so as to form a flat upper surface area of the second sacrificial film above the gate hole;

(e) forming a conductive first emitter film on a whole surface of the second sacrificial film;

(f) forming a conductive second emitter film by applying conductive ultra-fine particles on the first emitter film and baking the ultra-fine particles; and (g) exposing a tip portion of the second emitter film on a side of the flat upper surface area of the first emitter film, by etching and removing an unnecessary portion including a portion of the first emitter film near the flat upper surface area.

2. A method of manufacturing a field emission element according to claim 1, wherein the step (b) forms a resist pattern having a predetermined shape on the insulating film and forms the hole through the insulating film by using the resist pattern as a mask, and said step (c) forms the first sacrificial film on a whole surface of the insulating film, forms the side spacer on the inner wall of the hole by etching back the first sacrificial film, and forms the gate hole through the gate film by using the side spacer as a mask.

3. A method of manufacturing a field emission element according to claim 1, wherein said step (f) includes a step of etching back the second emitter film to planarize a surface of the second emitter film.

4. A method of manufacturing a field emission element according to claim 1, wherein the substrate has an anode film under the gate film, with an insulating film being interposed therebetween, the method further comprises a step (h) of forming a slit through the second emitter film before said step (g), and said step (g) partially etches and removes the first emitter film and the insulating film in the substrate to expose the tip portion of the second emitter film and the anode film.

5. A method of manufacturing a field emission element according to claim 1, wherein said step (f) disposes the ultra-fine particle group made of at least one selected from the group consisting of Au, Pt, Pd and Ag on the first emitter film and bakes the particles.

6. A method of manufacturing a field emission element according to claim 1, wherein said step (f) forms the second emitter film by dispersing diamond fine particles in an electrolytically plated film made of at least one of Ni, Ca, Cu, Zn, and Cr through dispersive plating.

7. A method of manufacturing a field emission element according to claim 1, wherein said step (f) forms the second emitter film by directly applying the independent-dispersive ultra-fine particles in a dry state on the first emitter film, by using a jet printing system.

8. A method of manufacturing a field emission element according to claim 1, wherein said step (f) applies ultra-fine particles manufactured by a gas evaporation method and dispersed in organic solvent on the first emitter film and bakes the ultra-fine particles.

9. A method of manufacturing a field emission element according to claim 8, wherein the organic solvent is $\alpha$-terpineol.

10. A method of manufacturing a field emission element according to claim 6, wherein said step (f) forms the second emitter film by using colloidal solution dispersed with diamond ultra-fine particles having a uniform distribution of particle diameters and manufactured by implosion synthesis.

11. A method of manufacturing a field emission element according to claim 1, wherein said step (f) bakes the ultra-fine particles at 200° C. or lower.

* * * * *